US008553198B2

(12) United States Patent
Yao et al.

(10) Patent No.: US 8,553,198 B2
(45) Date of Patent: Oct. 8, 2013

(54) MASK PATTERN CORRECTION DEVICE, METHOD OF CORRECTING MASK PATTERN, LIGHT EXPOSURE CORRECTION DEVICE, AND METHOD OF CORRECTING LIGHT EXPOSURE

(75) Inventors: Teruyoshi Yao, Kawasaki (JP); Satoru Asai, Kawasaki (JP); Morimi Osawa, Kawasaki (JP); Hiromi Hoshino, Kawasaki (JP); Kouzou Ogino, Kawasaki (JP); Kazumasa Morishita, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/487,388

(22) Filed: Jun. 4, 2012

(65) Prior Publication Data
US 2012/0236279 A1 Sep. 20, 2012

Related U.S. Application Data

(62) Division of application No. 12/767,602, filed on Apr. 26, 2010, now Pat. No. 8,227,153, which is a division of application No. 10/995,215, filed on Nov. 24, 2004, now Pat. No. 7,732,107.

(30) Foreign Application Priority Data

Jul. 23, 2004 (JP) ................. 2004-216386

(51) Int. Cl.
*G03B 27/68* (2006.01)
*G03F 1/00* (2012.01)
*G03C 5/00* (2006.01)

(52) U.S. Cl.
USPC .................. 355/52; 430/5; 430/30

(58) Field of Classification Search
USPC ........................................ 355/52; 430/5, 30
See application file for complete search history.

(56) References Cited

U.S. PATENT DOCUMENTS

| 5,742,376 | A | 4/1998 | Makinouchi |
| 6,130,016 | A | 10/2000 | Kent |
| 7,577,556 | B2 | 8/2009 | Futatsuya et al. |
| 2001/0028983 | A1 | 10/2001 | Kawamura et al. |

(Continued)

FOREIGN PATENT DOCUMENTS

| JP | 9-97760 A | 4/1997 |
| JP | 2000-235945 A | 8/2000 |
| JP | 2004-126486 A | 4/2004 |
| WO | WO-99/46807 A1 | 9/1999 |

OTHER PUBLICATIONS

USPTO, (JELSMA) Notice of Allowance and Notice of Allowability, Mar. 30, 2012, in parent U.S. Appl. No. 12/767,602 [allowed].

(Continued)

*Primary Examiner* — Jonathan Jelsma
(74) *Attorney, Agent, or Firm* — Fujitsu Patent Center

(57) ABSTRACT

In view of realizing a lithographic process which makes it possible to estimate and correct flare with an extremely high accuracy, and causes only an extremely small dimensional variation in width, over the entire portion not only of a single shot region, but also of a single chip region, a mask pattern correction device of the present invention has a numerical aperture calculation unit calculating, for every single shot region, flare energy for a mask pattern corresponding to a transferred pattern, based on an exposure layout of a plurality of shot regions, or more specifically, while considering flare from a plurality of shot regions located around every single shot region.

2 Claims, 18 Drawing Sheets

(56) References Cited

U.S. PATENT DOCUMENTS

| | | |
|---|---|---|
| 2003/0147059 A1 | 8/2003 | Tokuda et al. |
| 2003/0147060 A1 | 8/2003 | Tokuda et al. |
| 2005/0030508 A1 | 2/2005 | Tokuda et al. |
| 2005/0200823 A1 | 9/2005 | Tokuda et al. |

OTHER PUBLICATIONS

USPTO, (JELSMA) Final Office Action, Nov. 21, 2011, in parent U.S. Appl. No. 12/767,602 [allowed].

USPTO, (JELSMA) Non-Final Office Action and Election/Restriction Requirement, May 9, 2011, in parent U.S. Appl. No. 12/767,602 [allowed].

Japanese Office Action, English summary, mailed Nov. 25, 2008.

USPTO, Issue Notification, May 19, 2010, in grand-parent U.S. Appl. No. 10/995,215 [issued U.S. Patent No. 7,732,107].

USPTO, (JELSMA) Notice of Allowance and Notice of Allowability, Jan. 26, 2010, in grand-parent U.S. Appl. No. 10/995,215 [issued U.S. Patent No. 7,732,107].

USPTO, (JELSMA) Non-Final Office Action, Jun. 17, 2009, in grand-parent U.S. Appl. No. 10/995,215 [issued U.S. Patent No. 7,732,107].

USPTO, (JELSMA) Final Office Action, Dec. 22, 2008, in grand-parent U.S. Appl. No. 10/995,215 [issued U.S. Patent No. 7,732,107].

USPTO, (JELSMA) Non-Final Office Action (Election/Restrictions identified), Apr. 1, 2008, in grand-parent U.S. Appl. No. 10/995,215 [issued U.S. Patent No. 7,732,107].

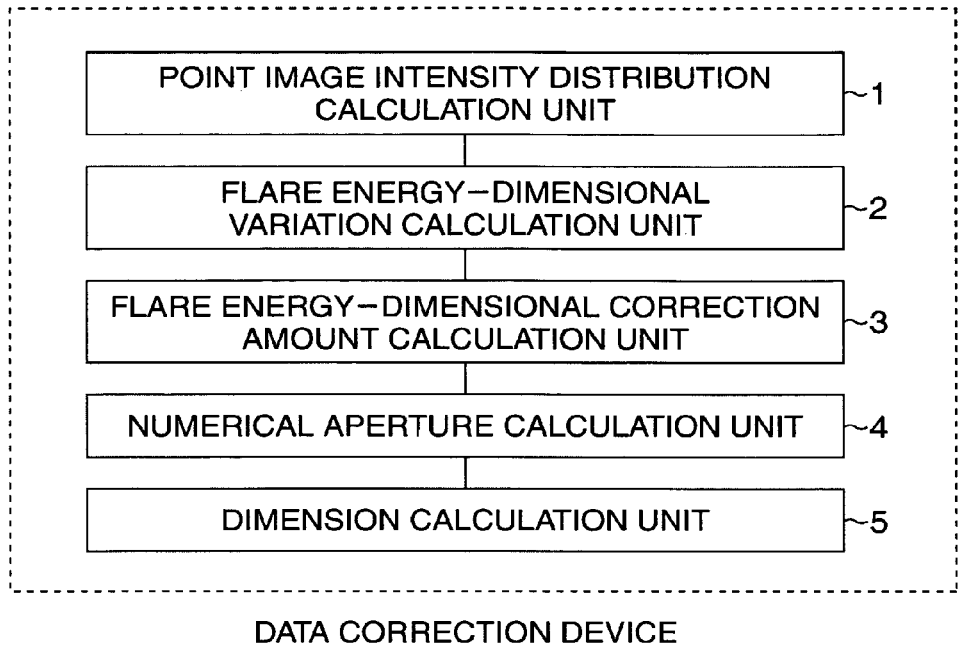
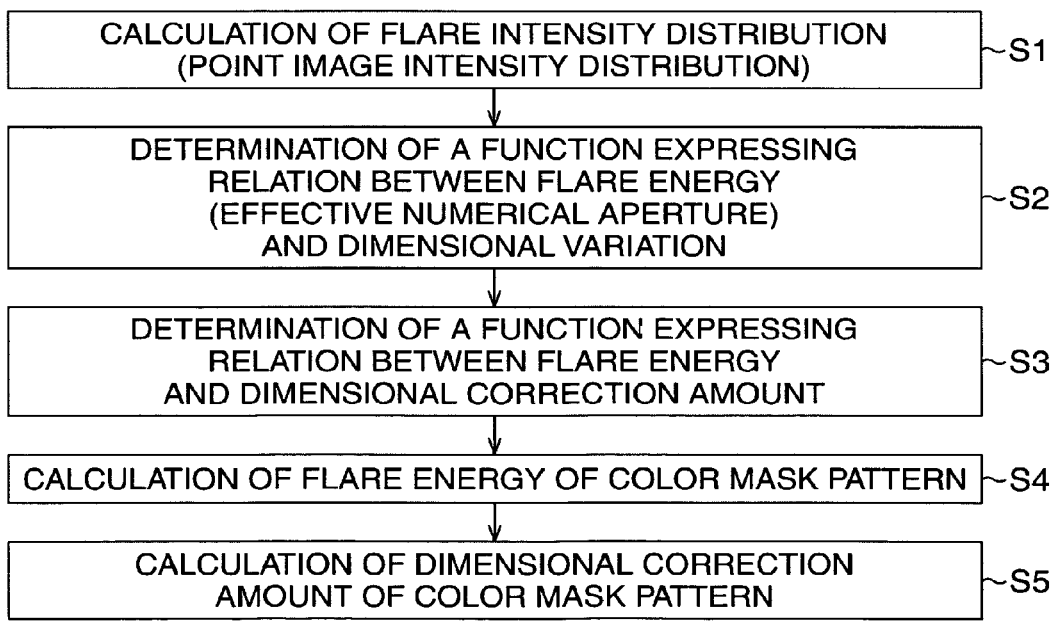

PATTERN A

PATTERN B
(INNER DIAMETER OF CIRCLE=4.14μm,
 WIDTH OF CIRCLE=2.76μm)

PATTERN C
(INNER DIAMETER OF CIRCLE=6.89μm,
 WIDTH OF CIRCLE=2.76μm)

⋮

DATA CORRECTION DEVICE

LIGHT EXPOSURE CORRECTION DEVICE

LIGHT EXPOSURE CORRECTION DEVICE

LIGHT EXPOSURE CORRECTION DEVICE

MASK PATTERN CORRECTION DEVICE, METHOD OF CORRECTING MASK PATTERN, LIGHT EXPOSURE CORRECTION DEVICE, AND METHOD OF CORRECTING LIGHT EXPOSURE

CROSS-REFERENCE TO RELATED APPLICATIONS

This application is based upon and claims the benefit of priority from the prior Japanese Patent Application No. 2004-216386, filed on Jul. 23, 2004, the entire contents of which are incorporated herein by reference.

BACKGROUND OF THE INVENTION

1. Field of the Invention

The present invention relates to a device and method for correcting mask pattern which can correct flare generated in lithographic process, one of a process step in fabrication of semiconductor devices, and also to a device and method for correcting light exposure.

2. Description of the Related Art

Recent pattern formation of semiconductor devices adopts projection exposure apparatuses based on dioptric system or cata-dioptric system. In this sort of projection exposure apparatus, light ascribable to some optical routes not intended on the design basis, tends to generate due to reflection and scattering on the surface or inside of lenses in the lighting optical system, photomask, projection lens and so forth, or due to non-uniformity in refractive index of lens materials. The light is generally referred to as "flare", and is causative of variation in a pattern to be transferred or in line width.

FIG. 25 is a drawing schematically showing a mode of flare generation.

In a unit shot region 121 for a single time of light exposure, a transferred pattern formed by light exposure through a mask pattern on a photomask is irradiated also by flare of the exposure light, which has come through arbitrary regions B, C away from point A. It is known that distance over which the flare can affect reaches as long as several millimeters on the basis of distance transferred on a wafer, a target object for the pattern transfer. A flare affective to as far as several millimeters is referred to as "long-range flare", a flare of several micrometer affective to as far as several tens of micrometers is referred to as "midrange flare", and a flare affective to as far as several micrometers or less is referred to as "short-range" flare.

In recent years, as typically described in Patent Document 1, there is proposed a technique by which the midrange and short-range flares (local flares) are estimated by using a test pattern composed of a line pattern and an annular pattern surrounding thereof, and width of the transferred pattern is corrected based on the estimation.

[Patent Document 1] Japanese Patent Application Laid-Open No. 2004-126486

The above-described conventional technique could certainly estimate the local flares, which have never been even noticed as a problem to a reasonable degree, with a high accuracy, but it has been found that the method was suffering from difference in the correction accuracy locally in a single shot region, and could not be said as having reached a satisfactory accuracy yet. This applies not only the midrange and short-range flares, but also to the long-range flare, and this creates the present situation in need of development of a dimensional correction technique with a higher accuracy.

The present invention is conceived after considering the above-described subjects, and an objects thereof is to provide a device and method for correcting a mask pattern, and a device and method for correcting light exposure, all of which make it possible to estimate and correct flare with an extremely high accuracy, over the entire portion not only of a single shot region, but also of a single chip region, to thereby realize a lithographic process causative of only an extremely small dimensional variation in line width, and further to thereby realize highly-reliable semiconductor devices.

SUMMARY OF THE INVENTION

According to one aspect of the present invention, there is provided a mask pattern correction device used in pattern transfer, onto a target object for pattern transfer, of a mask pattern of a photomask under light exposure repeated multiple number of times to thereby form a transferred pattern, comprising a numerical aperture calculation unit calculating, for every single target region, a numerical aperture of the mask pattern corresponding to the transferred pattern, based on a layout of a plurality of the target regions; and a dimension calculation unit calculating a dimension of the mask pattern necessary for obtaining the transferred pattern of a predetermined dimension, using the numerical aperture calculated in the above.

According to another aspect of the present invention, there is provided a light exposure correction device used in pattern transfer, onto a target object for pattern transfer, of a mask pattern of a photomask under light exposure repeated multiple number of times to thereby form a transferred pattern, comprising a numerical aperture calculation unit calculating, for every single target region, a numerical aperture of the mask pattern corresponding to the transferred pattern, based on a layout of a plurality of the target regions; an irradiation energy distribution calculation unit calculating an irradiation energy distribution of the exposure light in the target region necessary for obtaining the transferred pattern of a predetermined dimension, using the numerical aperture calculated in the above; and an irradiation energy distribution adjustment unit adjusting the irradiation energy distribution of the exposure light in the target region, based on the irradiation energy distribution calculated in the above.

According to still another aspect of the present invention, there is provided a light exposure correction device used in pattern transfer, onto a target object for pattern transfer, of a mask pattern of a photomask under light exposure repeated multiple number of times to thereby form a transferred pattern, comprising a flare energy measurement unit measuring flare energy generated, when a unit shot region corresponding to a single time of light exposure is irradiated by the exposure light, around the unit shot region ascribable to the exposure light; an irradiation energy distribution calculation unit calculating an irradiation energy distribution of the exposure light in the unit shot region necessary for obtaining the transferred pattern of a predetermined dimension, based on the flare energy measured in the above; and an irradiation energy distribution adjustment unit adjusting the irradiation energy distribution of the exposure light in the unit shot region, based on the irradiation energy distribution calculated in the above.

According to still another aspect of the present invention, there is provided a method of correcting a mask pattern used in pattern transfer, onto a target object for pattern transfer, of a mask pattern of a photomask under light exposure repeated multiple number of times to thereby form a transferred pattern, comprising the steps of calculating, for every single target region, a numerical aperture of the mask pattern corresponding to the transferred pattern, based on a layout of a plurality of the target regions; and calculating a dimension of the mask pattern necessary for obtaining the transferred pattern of a predetermined dimension, using the numerical aperture calculated in the above.

According to still another aspect of the present invention, there is provided a method of correcting light exposure used in pattern transfer, onto a target object for pattern transfer, of a mask pattern of a photomask under light exposure repeated multiple number of times to thereby form a transferred pattern, comprising the steps of calculating, for every single target region, a numerical aperture of the mask pattern corresponding to the transferred pattern, based on a layout of a plurality of the target regions; calculating an irradiation energy distribution of the exposure light in the target region necessary for obtaining the transferred pattern of a predetermined dimension, using the numerical aperture calculated in the above; and adjusting the irradiation energy distribution of the exposure light in the target region, based on the irradiation energy distribution calculated in the above.

According to still another aspect of the present invention, there is provided a method of correcting light exposure used in pattern transfer, onto a target object for pattern transfer, of a mask pattern of a photomask under light exposure repeated multiple number of times to thereby form a transferred pattern, comprising the steps of measuring flare energy generated, when a unit shot region corresponding to a single time of light exposure is irradiated by the exposure light, around the unit shot region ascribable to the exposure light; calculating an irradiation energy distribution of the exposure light in the unit shot region necessary for obtaining the transferred pattern of a predetermined dimension, based on the flare energy measured in the above; and adjusting the irradiation energy distribution of the exposure light in the unit shot region, based on the irradiation energy distribution calculated in the above.

According to the present invention, it is made possible to estimate and correct flare with an extremely high accuracy, over the entire portion not only of a single shot region, but also of a single chip region, to thereby realize a lithographic process causative of only an extremely small dimensional variation in line width, and further to thereby realize highly-reliable semiconductor devices.

BRIEF DESCRIPTION OF THE DRAWINGS

FIG. 1 is a block diagram showing a schematic configuration of a mask pattern data correction device of a first embodiment;

FIG. 2 is a flow chart step-wisely showing a correction method using the data correction device of the first embodiment;

DETAILED DESCRIPTION OF THE PREFERRED EMBODIMENTS

Basic Concept of the Present Invention

Figure 3A:
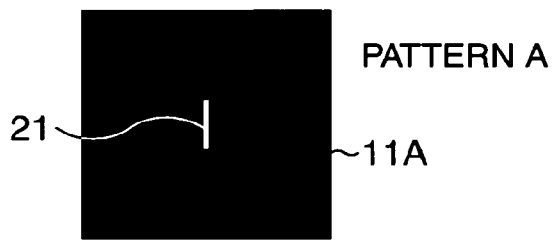
FIGS. 3A to 3C are schematic drawings of a photomask-for-testing used for quantifying flare intensity distribution.

The conventional technique was merely such as estimating a local flare while placing a focus only on a single shot region. The practical light exposure is, however, carried out by light exposure, repeated multiple number of times, of a resist layer on the surface of a wafer, so that any one shot region is inevitably affected mainly by neighboring shot regions adjacent thereto. Because accuracy of correction was found to degrade in particular in the peripheral portion of a shot region, the present inventors conceived an idea of estimating flare in a single shot region while considering also flare from a plurality of shot regions located around the target shot region.

The present invention classifies targets for the measurement into middle (short)-range flare and long-range flare, and proposes a configuration adapted to each of the flares. A configuration adapted to the former uses a mode of correcting design data of a photomask pattern, and a configuration adapted to the latter uses a mode of adjusting the irradiation energy distribution in the light exposure.

In a specific configuration of a mask pattern data correction adapted to the middle (short)-range flare, estimation of flare in a single shot region is made while taking a layout of a plurality of shot regions into consideration. In this case, a numerical aperture of a mask pattern corresponding to the transferred pattern is calculated while considering influence of flare from other shot regions other than the target shot region for the calculation, in other words, mask pattern data of other shot regions. This makes it possible to estimate an effective numerical aperture, or flare energy, also for the peripheral portion in the target shot region with a high accuracy similarly to that obtainable for the center portion. Dimension of the mask pattern necessary for obtaining the transferred pattern of a predetermined dimension is then calculated, using the numerical aperture calculated in the above. This is successful in realizing a lithographic process causing only an extremely small dimensional variation in width over the entire portion of the target shot region.

On the other hand, the long-range flare exerts its influence over a range as long as several millimeters, and shows a moderate variation in the intensity distribution thereof rather than in a local manner. It is therefore made possible to correct dimension of the transferred pattern by adjusting the exposure energy distribution in the target shot region.

In a specific configuration of correction of light exposure according to the present invention, similarly to as described in the above, estimation of flare in a single shot region is made while taking a layout of a plurality of shot regions into consideration, and a numerical aperture of a mask pattern corresponding to the transferred pattern is calculated while considering influence of flare from other shot regions other than the target shot region for the calculation, in other words, mask pattern data of other shot regions. Using thus-obtained numerical aperture, an irradiation energy distribution of the exposure light in the target shot region, in the reflection of influence of the long-range flare, is then calculated. Because the long-range flare shows a moderate variation in the intensity distribution as described in the above, and is therefore adjustable by a light exposure apparatus, the irradiation energy distribution of the exposure light in the target shot region is adjusted based on thus-calculated irradiation energy distribution, as it were, so as to produce an inverted distribution. This is successful in realizing a lithographic process causing only an extremely small dimensional variation in width over the entire portion of the target shot region.

In both of the mask pattern data correction and the light exposure correction described in the above, it is also allowable herein to correct a design value of the numerical aperture for the target shot region, using an average numerical aperture ascribable to a plurality of shot regions, in place of using the mask pattern data for other shot regions other than the target shot region for the calculation. This is successful in more readily realizing a lithographic process causing only an extremely small dimensional variation in width over the entire portion of the target shot region.

Although the above description dealt with the case where only a single shot region was used as a target region for the calculation, the target region may also be a chip region, or both of the shot region and chip region.

In an exemplary case where the chip region is used as a target region for the calculation, adoptable configurations include such as considering influences of the flare from other chip regions other than the target chip region for the calculation, and such as correcting a design value of the numerical aperture for the target chip region using an average numerical aperture ascribable to a plurality of chip regions, similarly to as described in the above. This is successful in realizing a lithographic process causing only an extremely small dimensional variation in width over the entire portion of the chip region.

In another specific configuration of the correction of light exposure according to the present invention, flare energy generated around the unit exposure region ascribable to the exposure light when the exposure light is irradiated on a single shot region is measured, and based on thus-measured flare energy, an irradiation energy distribution in the target shot region is adjusted typically taking a layout of a plurality of shot regions into consideration. This is successful in realizing a lithographic process causing only an extremely small dimensional variation in width over the entire portion of the target shot region.

Specific Embodiments Applied with the Present Invention

The following paragraphs will describe specific embodiments applied with the present embodiments, referring to the attached drawings.

First Embodiment

Mask pattern data correction adapted to middle (short)-range flare will be explained in this embodiment.

FIG. 1 is a block diagram showing a schematic configuration of a mask pattern data correction device of a first embodiment.

The data correction device is configured as having a point image intensity distribution calculation unit 1 calculating flare intensity distribution (point image intensity distribution) based on a result of dimensional measurement of a test pattern using a predetermined photomask-for-testing; a flare energy-dimensional variation calculation unit 2 calculating a relation between flare energy (effective numerical aperture) and dimensional variation using a dummy photomask adjusted in the numerical aperture; a flare energy-dimensional correction amount calculation unit 3 calculating a relation between flare energy and dimensional correction amount; a numerical aperture calculation unit 4 calculating, for every single shot region, flare energy for a mask pattern corresponding to a transferred pattern, based on an exposure layout of a plurality of shot regions, or more specifically, while considering flare from a plurality of shot regions located around every single shot region; and a dimension calculation unit 5 calculating a dimension of the mask pattern necessary for obtaining the transferred pattern of a predetermined dimension, using the flare energy calculated in the above.

FIG. 2 is a flow chart step-wisely showing a correction method using the above-described data correction device.

The data correction method of the present embodiment comprises five steps described below:

(1) calculation of flare intensity distribution (point image intensity distribution) (step S1);

(2) determination of a function expressing relation between flare energy (effective numerical aperture) and dimensional variation (step S2);

(3) determination of a function expressing relation between flare energy and dimensional correction amount (step S3);

(4) calculation of flare energy of the individual mask patterns (step S4); and (5) calculation of dimensional correction of the individual mask patterns (step S5).

The following paragraphs will detail the individual steps.

(1) Step S1

First, a flare intensity distribution of the light at a single point is determined.

Figure 3B:
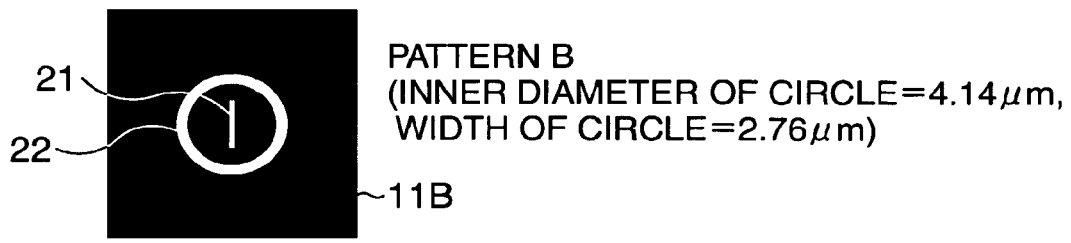
Figure 3C:
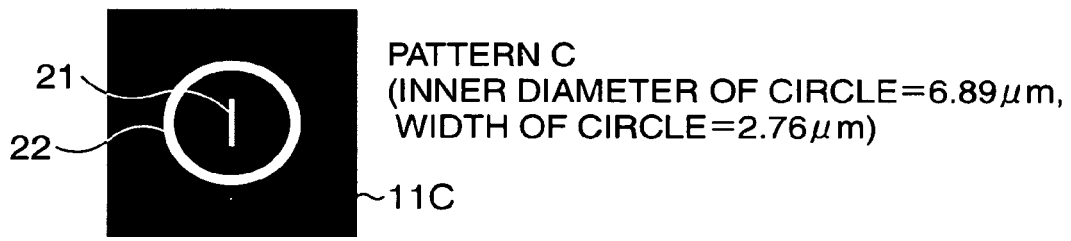
Figure 4:
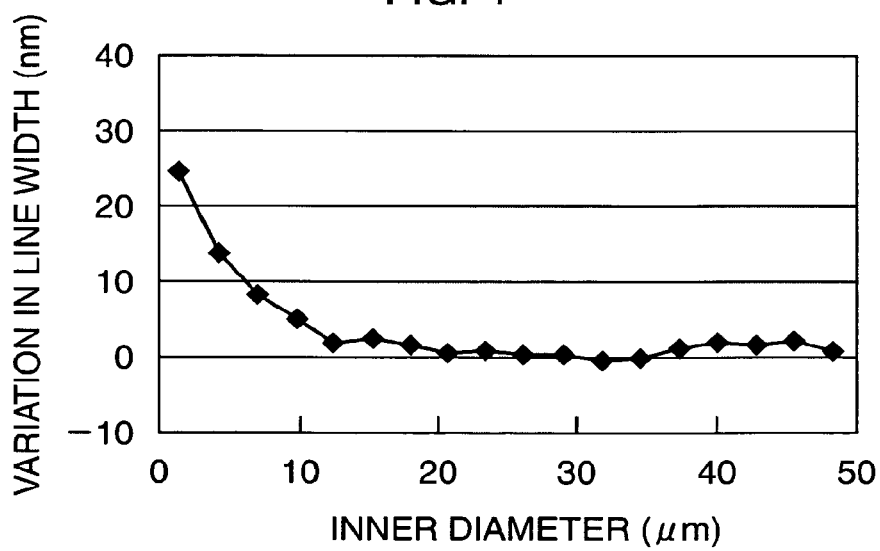
FIG. 4 is a characteristic chart plotting difference values against values of the inner diameter of the individual annular patterns.

FIGS. 3A to 3C are schematic drawings of a photomask-for-testing used for quantifying the flare intensity distribution, and FIG. 4 is a characteristic chart showing results of measurement of line width obtained after projection exposure through the photomask-for-testing shown in FIGS. 3A to 3C. FIG. 3A expresses a photomask-for-testing 11A, FIG. 3B expresses a photomask-for-testing 11B, and FIG. 3C expresses a photomask-for-testing 11C, respectively.

The photomasks-for-testing 11A, 11B, 11C, . . . has test patterns A to C, . . . , respectively in this order, and each of these test patterns has a basic configuration in which a line pattern 21 and an annular pattern 22 surrounding therearound and forming an annular light transmissive region are combined.

The test pattern A of the photomask-for-testing 11A is composed only of a line pattern 21 never affected by flare, ensuring complete interception of light within a 100-μm radius around the line pattern 21. The test pattern B of the photomask-for-testing 11B is composed of a line pattern 21 and an annular pattern 22 arranged therearound so as to form a light transmissive region having an inner diameter of 4.14 μm and an outer diameter of 6.89 μm, ensuring that no pattern other than the annular pattern 21 is formed within an area away, by a distance in need of considering influence by the local flare, from the line pattern 21. The test pattern C of the photomask-for-testing 11C is composed of a line pattern 21 and an annular pattern 22 arranged therearound so as to form a light transmissive region having an inner diameter of 6.89 μm and an outer diameter of 9.65 μm, ensuring that no pattern other than the annular pattern 21 is formed within an area away, by a distance in need of considering influence by the local flare, from the line pattern 21. As described in the above, the individual annular patterns 22 are increased in the inner diameter of the annulus ring from 4.14 to 48.25 μm in increments of 2.76 μm, while keeping the width of the annulus ring constant at 2.76 μm, so that the inner diameter of the one equals to the outer diameter of the next.

In step S1, first, a photoresist is irradiated through the test patterns A to C, . . . , of the photomasks-for-testing 11A to 11C, . . . , developed, and then subjected to measurement of width of the resultant line patterns 21.

Next, a measured value of the line width of the line pattern 21 in the test pattern A is compared with measured values of the line width of the individual line patterns 21 in the test patterns B, C . . . , that is, the difference in the line width respectively between test pattern A and test patterns B, C, . . . are calculated. The difference values express variation in the line width ascribable to the local flare, wherein the smaller the value becomes, the smaller the local flare with respect to the line pattern 21 becomes, and the larger the value becomes, the larger the local flare with respect to the line pattern 21 becomes.

Influence of the local flare through the individual annular patterns 22 of the test patterns B, C, . . . , that is, the individual difference values with that of the test pattern A, are quantified based on distance between the center portion of the line pattern 21 and the annular pattern 22, or more specifically, in terms of the values of the inner diameter of the individual annular patterns 22.

Figure 5:
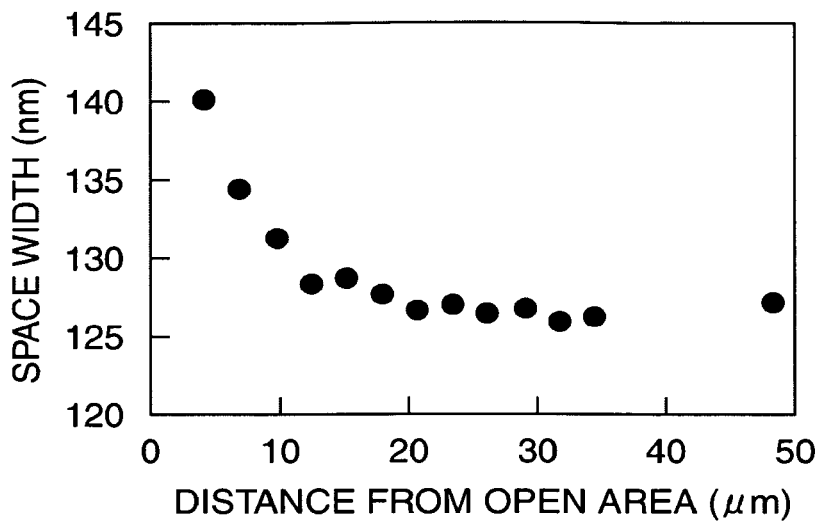
FIG. 5 is a characteristic chart showing relations between distance from a line pattern to the individual annular patterns and measured line width.

FIG. 4 shows the difference values plotted against values of the inner diameter of the individual annular patterns 22, and FIG. 5 shows relations between distance from the line pattern 21 to the individual annular patterns 22 and measured values of the line width.

It is found that influence of the local flare becomes large for an inner diameter of the annular pattern 22 of approximately 12 μm or less, but is almost unobservable beyond 12 μm.

It is to be noted that the inner diameter of the annulus ring of the annular pattern 22 fell within a range from 4.14 μm to 48.25 μm in the aforementioned embodiment, wherein it is also allowable to appropriately select an optimum range case-by-case, because every light exposure apparatus has a different influential range of the flare. Smaller setting of the width of the annulus ring, which was set to 2.76 μm in the aforementioned embodiment, will make it possible to further finely quantify the influence of the local flare corresponding to the distance.

Local flare intensity distribution of a point light source is now assumed by a double-Gaussian distribution expressed as below:

$$f(r) = A\left\{\frac{1}{\sigma_1^2}\exp\left(-\frac{r^2}{2\sigma_1^2}\right) + \frac{B}{\sigma_2^2}\exp\left(-\frac{r^2}{2\sigma_2^2}\right)\right\} \quad (1)$$

r: distance of flare;
A: constant;
$\sigma_1$, $\sigma_2$: standard deviation in Gaussian distribution; and
B: intensity ratio in Gaussian distribution.

Figure 6:
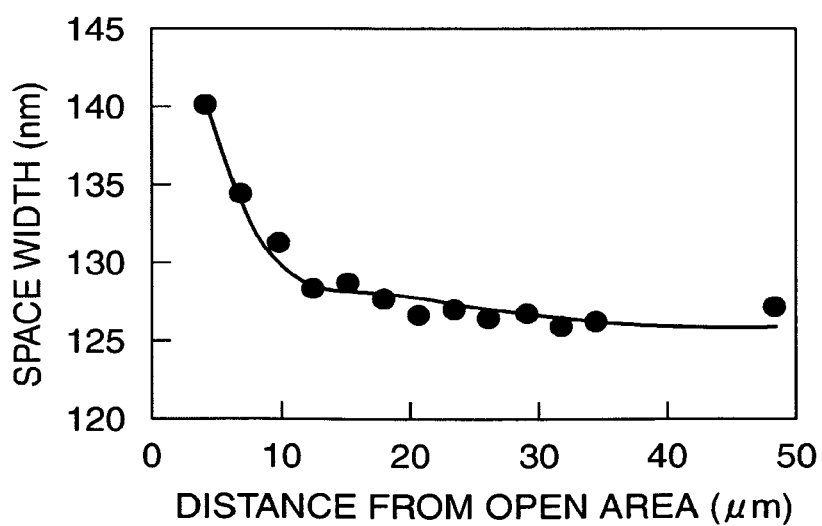
FIG. 6 is a characteristic chart showing a fitted result of the results shown in FIG. 5 through integration using equation (1)

Local flare energy of the individual test patterns shown in FIGS. 3A to 3C can be determined by integrating equation (1) using a point image intensity distribution calculation unit 1. FIG. 6 shows a fitted result of the results shown in FIG. 5 through integration using equation (1). The fitted result is satisfactory as shown in the drawing, and this proves an excellent accuracy in the calculation of flare intensity distribution. The flare energy corresponding to the individual patterns can be determined by calculating the flare energy from opening portions in the periphery of the pattern, using equation (1).

(2) Step S2

First, an integrated value of equation (1) is obtained using a photomask having a transmissive portion over the entire surface thereof. This value is normalized as 100%, and is defined as an effective numerical aperture.

Figure 7A:
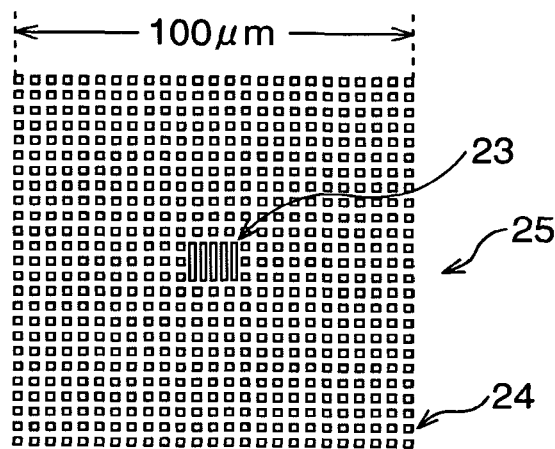
FIG. 7A shows a schematic drawing of a photomask-for-testing having a measurement pattern and a dummy pattern arranged therearound.
Figure 7B:
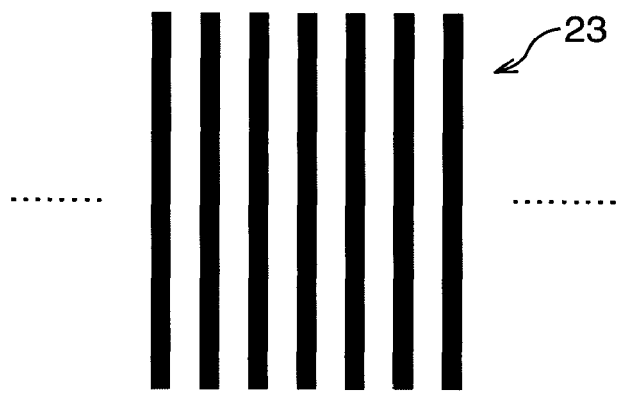
FIG. 7B shows an enlarged view of the measurement pattern 23.
Figure 8:
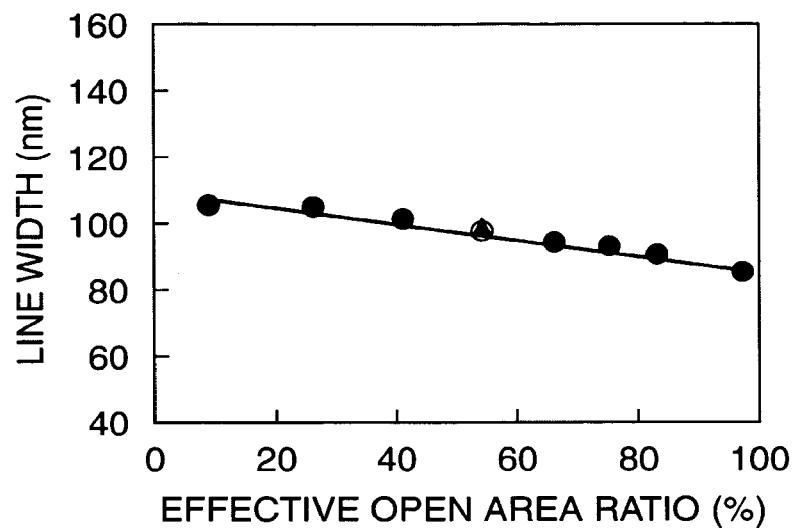
FIG. 8 is a characteristic chart showing a relation between dimensional variation of a test pattern and effective numerical aperture under varied dimension of the dummy pattern.

Relation between the effective numerical aperture and dimensional variation can be determined by using a photomask-for-testing 25, shown in FIG. 7A, having a measurement pattern 23 and a dummy pattern arranged therearound. FIG. 7B shows an enlarged view of the measurement pattern 23. Dimensional variation of the measurement pattern 23 under varied dimension of the dummy pattern 24 on a halftone-type phase shift mask is then calculated in relation to the effective numerical aperture, using a flare energy-dimensional variation calculation unit 2 and various photomasks-for-testing 25 differing in area of the dummy pattern 24. Results of the calculation is shown in FIG. 8. It is found that the effective numerical aperture and the dimensional variation is almost in a linear relation. The dimensional variation for the unit numerical aperture herein is found to be 0.23 nm.

(3) Step S3

In the practical local flare correction of the photomask, it is necessary to handle the dimensional variation of the pattern in consideration of so-called MEEF (mask error enhancement factor) which expresses dimensional variation of the resist pattern. Correction amount M per unit numerical aperture can be determined by the equation below:

$$M = \text{dimensional variation per unit numerical aperture of the individual pattern/MEEF}.$$

Using the flare energy-dimensional correction amount calculation unit 3 and the equation in the above, a relation between the flare energy and dimensional variation determined in step S2 is converted into a relation between the flare energy and mask dimensional correction amount. An experimentally-obtained value of MEEF is 1.5, so that the mask correction amount per unit numerical aperture of the individual patterns is given as 0.17 nm.

(4) Step S4

Figure 9:
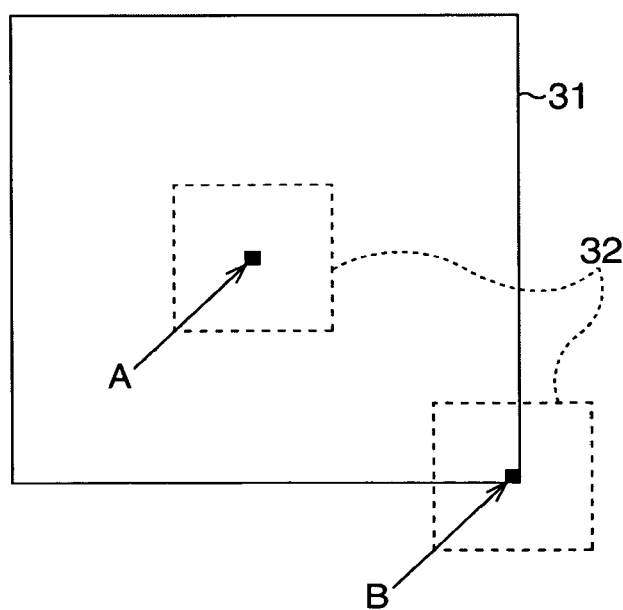
FIG. 9 is a schematic drawing showing a design data in a single shot region of a photomask.
Figure 10:
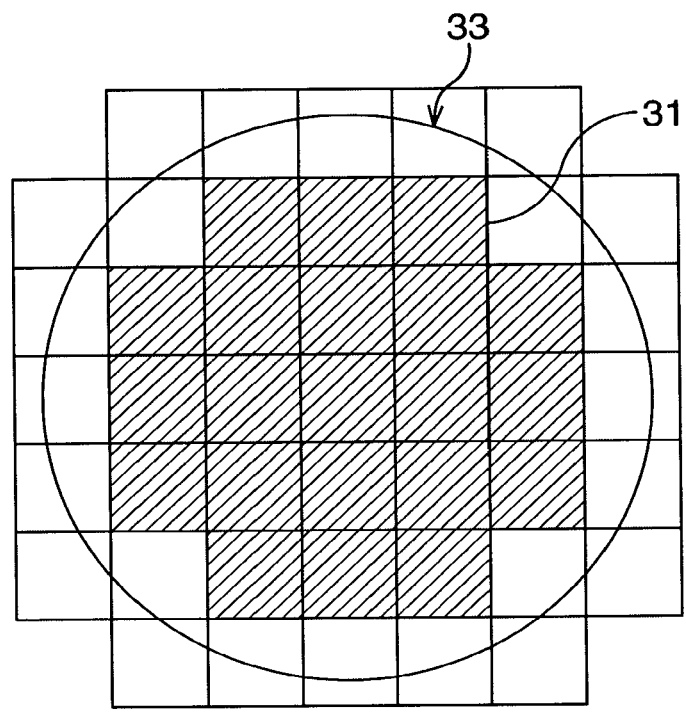
FIG. 10 is a schematic drawing showing an exposure layout of a plurality of shot regions.

FIG. 9 is a schematic drawing showing a design data in a single shot region of the photomask, and FIG. 10 is a schematic drawing showing an exposure layout of a plurality of shot regions. In FIG. 9, a rectangular region surrounded by a solid line expresses mask data corresponding to a single shot region 31, and rectangular regions surrounded by a broken line express flare regions 32 in which the flare around the center points thereof should be considered. FIG. 10 shows an exposure layout of the shot regions in light exposure on a wafer 33, which is a target object for pattern transfer, wherein every single rectangle surrounded by solid lines expresses a single shot region 31. The hatched shot regions 31 are effective shot regions.

Figure 11:
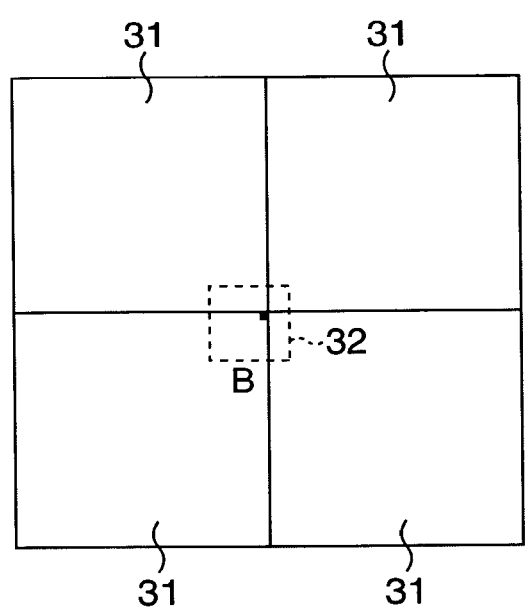
FIG. 11 is a schematic drawing showing a plurality of (three, in the illustrated example) shot regions located around a target shot region.

For calculation of the effective numerical aperture of the flare region 32 surrounded by the broken line around point A in FIG. 9, it is all enough to consider only the shot region 31 because the entire portion of the flare region 32 falls in the shot region 31. In contrast to this, for calculation of the effective numerical aperture of the flare region 32 surrounded by the broken line around point B, the mask pattern data for the shot region 31 only is insufficient because a part of the flare region 32 falls outside the shot region 31. In this embodiment, using the numerical aperture calculation unit 4, the effective numerical aperture is calculated taking not only the shot region 31, but also the exposure layout of a plurality, of shot regions 31 shown in FIG. 10 into consideration, in other words, while considering also flare from a plurality of (three in the illustrated example) shot regions 31 located around a target shot region as shown in FIG. 11.

In view of raising the process speed, the calculation herein adopts so-called area density method, by which the shot region 31 is divided into a plurality of correction regions, and the numerical aperture is calculated for every correction region. More specifically, the shot region 31 is divided according to a several-micrometer-square mesh within a range typically 100 µm away from the target pattern in the exposure region, which is 1-µm-square mesh for example, and the numerical aperture is calculated assuming it as uniform within the mesh. This technique, called area density method, is successful in raising the processing speed to a considerable degree.

(5) Step S5

Thereafter, using the dimension calculation unit 5, the values of the effective numerical aperture of the individual patterns calculated in step S4 are entered to the equation, obtained in step S3, expressing relation between the numerical aperture and mask dimensional correction amount, so as to calculate values of the dimensional correction amount of the mask pattern having the individual patterns, to thereby correct the mask pattern data of the photomask.

As has been described in the above, the present embodiment makes it possible to estimate and correct flare with an extremely high accuracy, over the entire portion of a single shot region, to realize a lithographic process causative of only an extremely small dimensional variation in line width, and further to thereby realize highly-reliable semiconductor devices.

Modified Example

Next paragraphs will explain modified example 1 of the first embodiment. The present modified example is different from the first embodiment in that an average numerical aperture ascribable to a plurality of shot regions is used in place of the mask pattern data for other shot regions other than the target shot region for the calculation.

Figure 12:
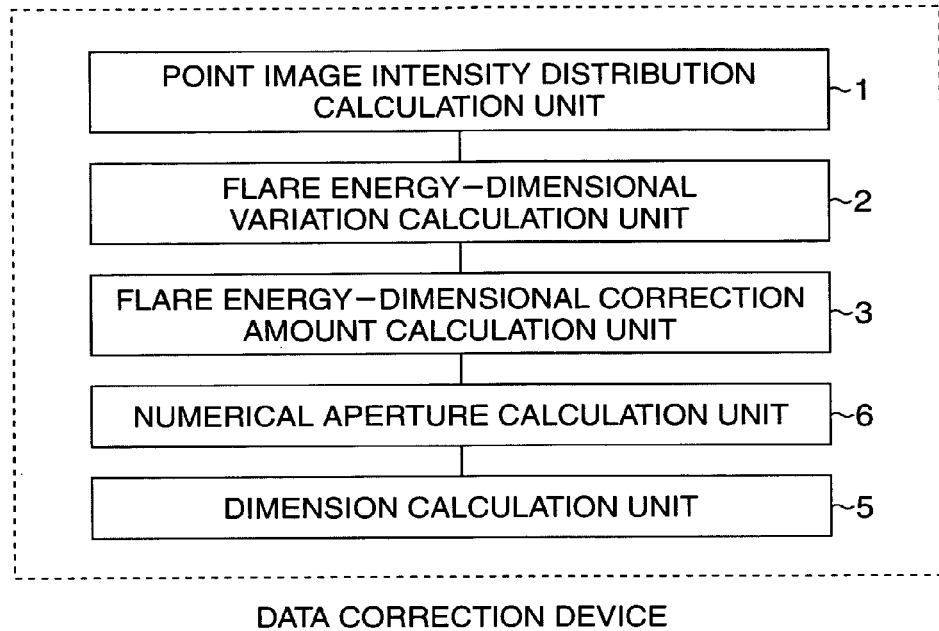
FIG. 12 is a block diagram showing a schematic configuration of a mask pattern data correction device according to modified example 1 of the first embodiment.

FIG. 12 is a block diagram showing a schematic configuration of a mask pattern data correction device of modified example 1.

The data correction device is configured as having a point image intensity distribution calculation unit 1 calculating flare intensity distribution (point image intensity distribution) based on a result of dimensional measurement of a test pattern using a predetermined photomask-for-testing; a flare energy-dimensional variation calculation unit 2 calculating a relation between flare energy (effective numerical aperture) and dimensional variation using a dummy photomask adjusted in the numerical aperture; a flare energy-dimensional correction amount calculation unit 3 calculating a relation between flare energy and dimensional correction amount; a numerical aperture calculation unit 6 calculating, for every single shot region, flare energy for a mask pattern corresponding to a transferred pattern, while considering an average numerical aperture ascribable to a plurality of shot regions; and a dimension calculation unit 5 calculating a dimension of the mask pattern necessary for obtaining the transferred pattern of a predetermined dimension, using the flare energy calculated by the numerical aperture calculation unit 6.

Figure 13:
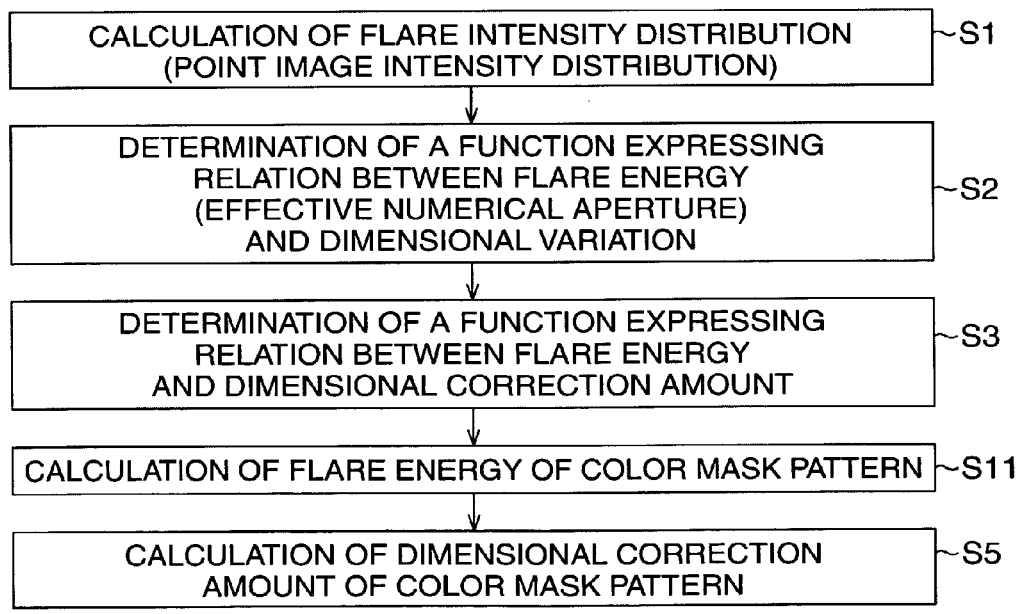
FIG. 13 is a flow chart step-wisely showing a correction method using the data correction device according to modified example 1 of the first embodiment.

FIG. 13 is a flow chart step-wisely showing the correction method using the above-described data correction device.

First, steps S1, S2 and S3 in FIG. 2 explained in the first embodiment are executed.

Figure 14:
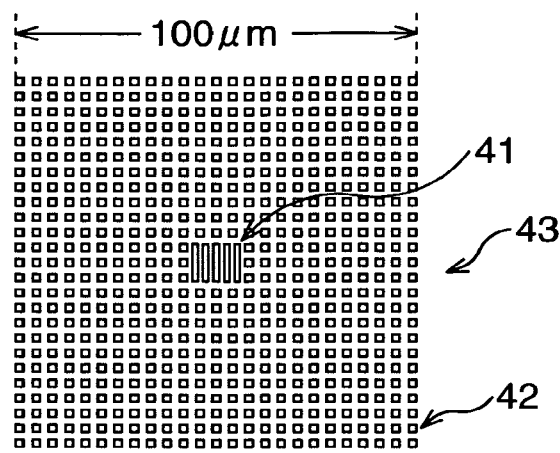
FIG. 14 is a schematic drawing of a photomask having a mask pattern and dummy pattern arranged therearound so as to adjust the numerical aperture.

Next in step S11, using a numerical aperture calculation unit 6, the effective numerical aperture in the shot region 31 is calculated while considering an average numerical aperture ascribable to a plurality of shot regions. In this process, the effective numerical aperture in the shot region 31 is corrected using data of a photomask 43, shown in FIG. 14, having a mask pattern 41 and a dummy pattern 42 arranged therearound and thereby having an adjusted numerical aperture. The area density method is adopted herein in view of raising the process speed.

Thereafter in step S5, using the dimension calculation unit 5, the values of the effective numerical aperture of the individual patterns calculated in step S11 are entered to the equation, determined in step S3, expressing relation between the numerical aperture and mask dimensional correction amount, so as to calculate values of the dimensional correction amount of the mask pattern having the individual patterns, to thereby correct the mask pattern data of the photomask.

As has been described in the above, the present modified example makes it possible to estimate and correct flare with an extremely high accuracy and in a simple manner, over the entire portion of a single target shot region, by considering influence of flare from the peripherals of the target shot region as an average numerical aperture, and also makes it possible to realize a lithographic process causative of only an extremely small dimensional variation in line width, and further to thereby realize highly-reliable semiconductor devices.

Modified Example 2

Next paragraphs will describe modified example 2 of the first embodiment.

The present modified example uses not only the mask pattern data of other shot regions other than the target shot region for the calculation, but uses also the mask pattern data of the chip regions other than the target chip region for the calculation.

Figure 15B:
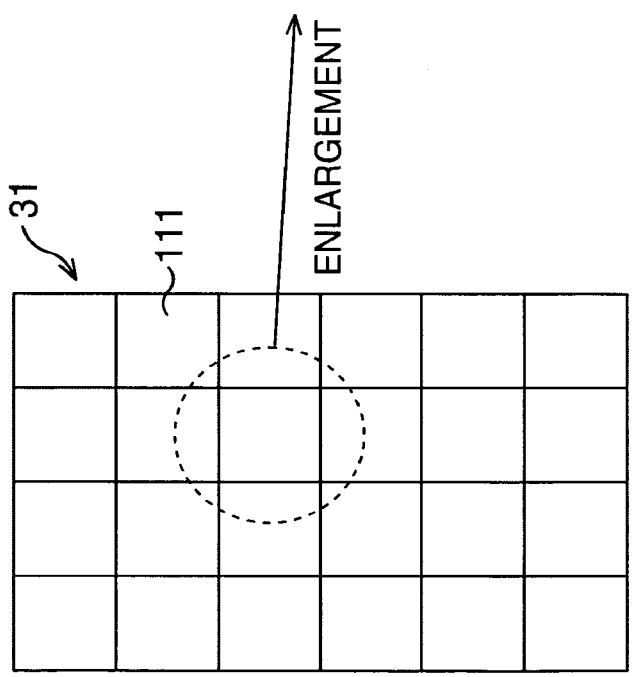
FIG. 15B shows an enlarged view of a single chip region.
Figure 15A:
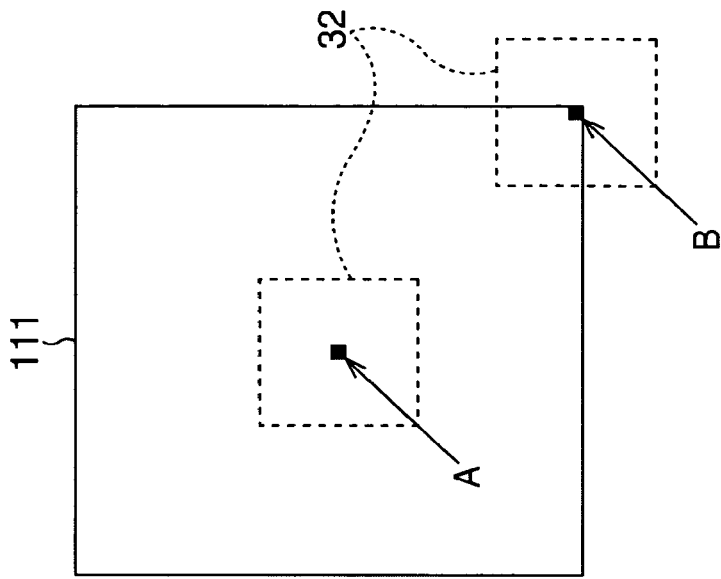
FIG. 15A schematically shows a single shot region of an actual device.

Correction processing of design data, such as flare correction, proximity effect correction and so forth, is generally carried out respectively for every device chip region. FIG. 15A schematically shows a single shot region of an actual device, and FIG. 15B shows an enlarged view of a single chip region shown in FIG. 15A. The shot region 31 has 4×6 chip regions 111 arranged therein. A pattern of point "A" is corrected in the mask dimension thereof, by calculating flare energy from the flare region 32, which is a range (surrounded by a broken line) possibly be affected by the surrounding regions. Also a pattern of point "B" may similarly be affected by the flare region 32 indicated as being surrounded by a broken line, but the conventional technique does not consider the influence of the surrounding chip regions, because calculation of the flare energy is made on the chip basis. In the light exposure, it is also necessary for the conventional technique to take influences of the surrounding shots into consideration, because the light exposure is carried out based on an exposure layout shown in FIG. 10.

In the present modified example, it is allowable, using the data correction device explained in the first embodiment, to execute steps S1 to S3 and step S5 similarly to as described in the above, and to calculate, in step S4, the flare energy of the individual mask patterns, wherein the effective numerical aperture is calculated for every chip region, referring respectively to the pattern data of the chip region adjacent to the target chip region, and pattern data of the shot region adjacent to the target chip region inconsideration of the exposure layout shown in FIG. 10.

It is also allowable to apply the present modified example to modified example 1, and to calculate, in step S11, the flare energy of the individual mask patterns, wherein the effective numerical aperture is calculated for every chip region, referring respectively to the pattern data of the chip region adjacent to the target chip region, and pattern data of the shot region adjacent to the target chip region inconsideration of the exposure layout shown in FIG. 10.

As has been described in the above, the present modified example makes it possible to estimate and correct flare with an extremely high accuracy and in a simple manner, over the entire portion of a single chip region, by considering influence of flare from the peripherals of the chip region as an average numerical aperture, and also makes it possible to realize a lithographic process causative of only an extremely small dimensional variation in line width, and further to thereby realize highly-reliable semiconductor devices.

Second Embodiment

The present embodiment will explain light exposure correction adapted to the long-range flare.

Figure 16:
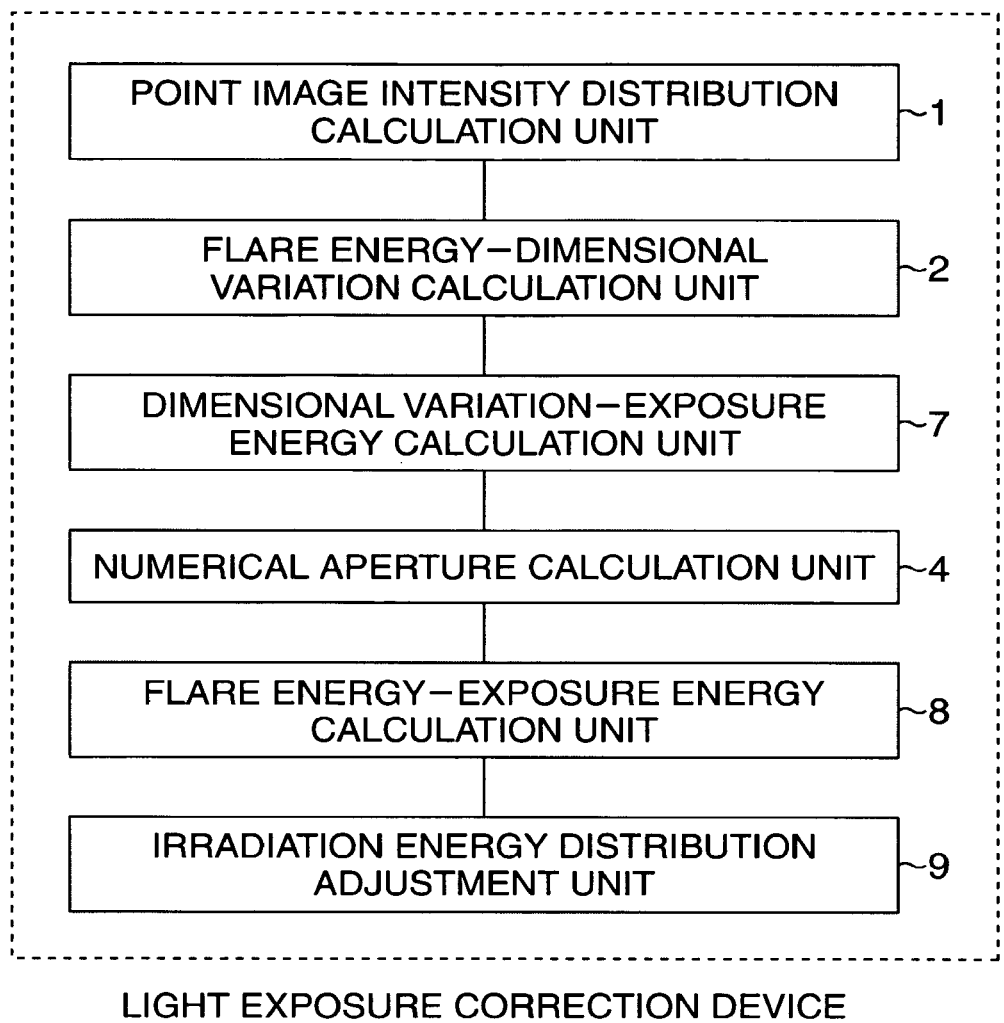
FIG. 16 is a block diagram showing a schematic configuration of a mask pattern data correction device of a second embodiment.

FIG. 16 is a block diagram showing a schematic configuration of a light exposure correction device of the second embodiment.

The light exposure correction device is configured as having a point image intensity distribution calculation unit 1 calculating flare intensity distribution (point image intensity distribution) based on a result of dimensional measurement of a test pattern using a predetermined photomask-for-testing; a flare energy-dimensional variation calculation unit 2 calculating a relation between flare energy (effective numerical aperture) and dimensional variation using a dummy photomask adjusted in the numerical aperture; a dimensional variation-exposure energy calculation unit 7 calculating a relation between the dimensional variation and irradiation energy (exposure energy) distribution; a numerical aperture calculation unit 4 calculating, for every single shot region, flare energy for a mask pattern corresponding to a transferred pattern, based on an exposure layout of a plurality of shot regions, or more specifically, while considering flare from a plurality of shot regions located around every single shot region; a flare energy-exposure energy calculation unit 8 calculating a relation between the flare energy and an irradiation energy distribution; and an irradiation energy distribution adjustment unit 9 adjusting the irradiation energy distribution of the exposure light in the shot region based on the irradiation energy distribution calculated in the above. The dimensional variation-exposure energy calculation unit 7 and the flare energy-exposure energy calculation unit 8 herein composes an irradiation energy distribution calculation unit calculating an irradiation energy distribution of the exposure light in the shot region necessary for obtaining a transferred pattern of a predetermined dimension, using the flare energy calculated in the above.

Figure 17:
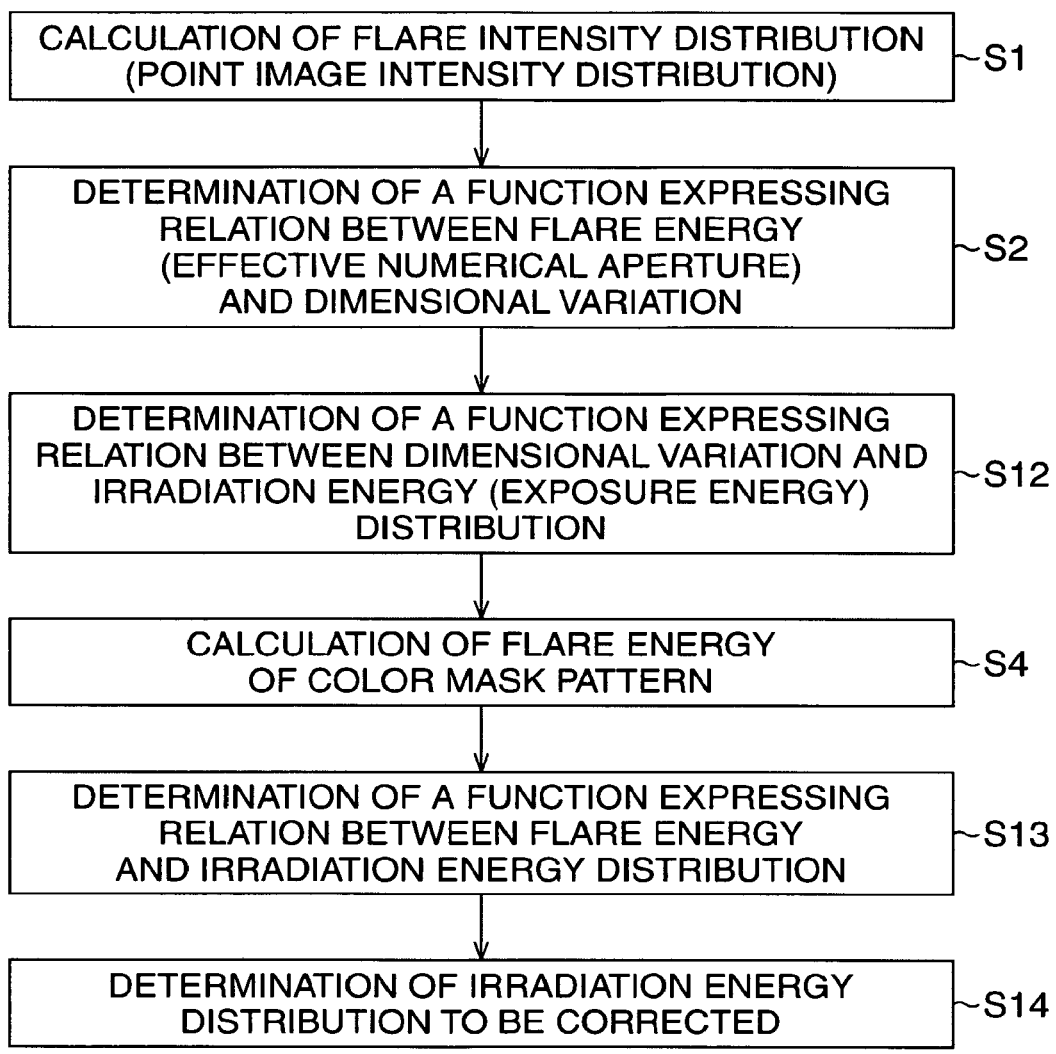
FIG. 17 is a flow chart step-wisely showing a correction method using the data correction device of the second embodiment.

FIG. 17 is a flow chart step-wisely showing the correction method using the above-described light exposure correction device.

First, steps S1 and S2 in FIG. 2 explained in the first embodiment are executed.

Next in step S12, using the dimensional variation-exposure energy calculation unit 7, a relation between dimensional variation and irradiation energy (exposure energy) distribution is determined. The relation between the irradiation energy distribution and dimensional variation can be determined by measuring dimension of the transferred patterns formed under light exposure varied in the exposure energy.

Next, step S4 in FIG. 2, explained in the first embodiment is executed. Next in step S13, using the flare energy-exposure energy calculation unit 8, a relation between the flare energy and irradiation energy distribution is determined, based on the relation between flare energy and dimensional variation determined in step S2, and also on the relation between irradiation energy distribution and dimensional variation determined in step S3.

Thereafter in step S14, using the irradiation energy distribution calculation unit 9, values of the effective numerical aperture of the individual patterns, calculated in step S4, are converted into an irradiation energy distribution, and an irradiation energy distribution to be corrected is determined, using the relation between the flare energy and irradiation energy distribution determined in step S13.

As has been described in the above, the present embodiment makes it possible to estimate and correct flare with an extremely high accuracy, over the entire portion of a single shot region, to realize a lithographic process causative of only an extremely small dimensional variation in line width, and further to thereby realize highly-reliable semiconductor devices.

Modified Example

Next paragraphs will describe a modified example of the second embodiment. This embodiment differs from the first embodiment in that an average numerical aperture of a plurality of shot regions is used, in place of the mask pattern data of other shot regions other than the target shot region for the calculation.

Figure 18:
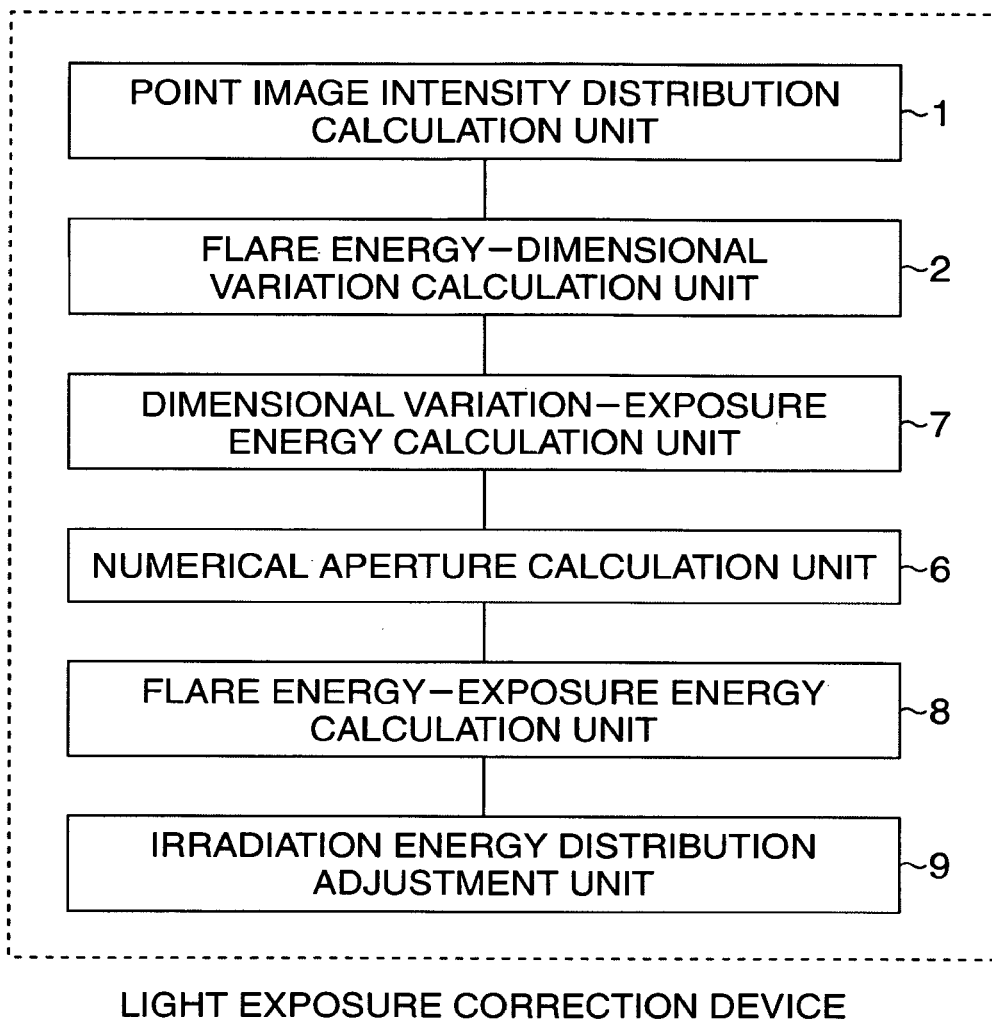
FIG. 18 is a block diagram showing a schematic configuration of a mask pattern data correction device according to a modified example of the second embodiment.

FIG. 18 is a block diagram showing a schematic configuration of a mask pattern data correction device according to the present modified example.

The data correction device is configured as having a point image intensity distribution calculation unit 1 calculating flare intensity distribution (point image intensity distribution) based on a result of dimensional measurement of a test pattern using a predetermined photomask-for-testing; a flare energy-dimensional variation calculation unit 2 calculating a relation between flare energy (effective numerical aperture) and dimensional variation using a dummy photomask adjusted in the numerical aperture; a dimensional variation-exposure energy calculation unit 7 calculating a relation between the dimensional variation and irradiation energy (exposure energy) distribution; a numerical aperture calculation unit 6 calculating, for every single shot region, flare energy for a mask pattern corresponding to a transferred pattern, while considering an average numerical aperture ascribable to a plurality of shot regions; a flare energy-exposure energy calculation unit 8 calculating a relation between the flare energy and an irradiation energy distribution; and an irradiation energy distribution adjustment unit 9 adjusting the irradiation energy distribution of the exposure light in the shot region based on the irradiation energy distribution calculated in the above.

Figure 19:
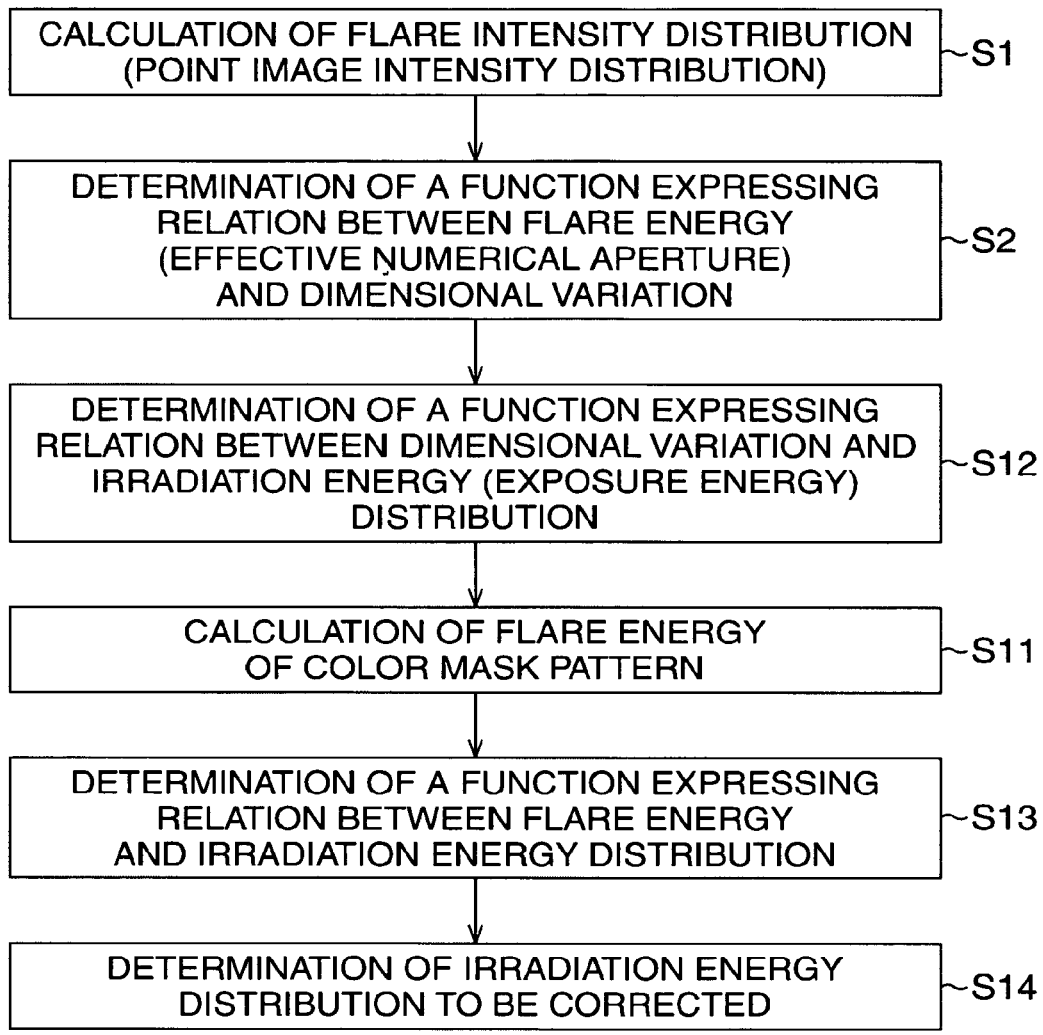
FIG. 19 is a flow chart step-wisely showing a correction method using the data correction device according to the modified example of the second embodiment.

FIG. 19 is a flow chart step-wisely showing the correction method using the above-described light exposure correction device.

First, steps S1 and S2 in FIG. 17 explained in the first embodiment are executed.

Next in step S11, using a numerical aperture calculation unit 6, the effective numerical aperture in the shot region 31 is calculated while considering an average numerical aperture ascribable to a plurality of shot regions. In this process, the effective numerical aperture in the shot region 31 is corrected using data of a photomask 43, shown in FIG. 14, having a mask pattern 41 and a dummy pattern 42 arranged therearound and thereby having an adjusted numerical aperture. The area density method is adopted herein in view of raising the process speed.

Next, step S13 in FIG. 17 explained in the second embodiment is executed.

Thereafter in step S14, using the irradiation energy distribution calculation unit 9, values of the effective numerical aperture of the individual patterns, calculated in step S11, are converted into an irradiation energy distribution, and an irradiation energy distribution to be corrected is determined using the relation between the flare energy and irradiation energy distribution determined in step S13.

As has been described in the above, the present modified example makes it possible to estimate and correct flare with an extremely high accuracy and in a simple manner, over the entire portion of a single target shot region, by considering influence of flare from the peripherals of the target shot region as an average numerical aperture, and also makes it possible to realize a lithographic process causative of only an extremely small dimensional variation in line width, and further to thereby realize highly-reliable semiconductor devices.

It is also allowable to apply the technical spirit of the modified example of the first embodiment to the second embodiment and the modified example thereof, and to calculate, in step S4 (step S11 in the modified example), the flare energy of the individual mask patterns, wherein the effective numerical aperture is calculated for every chip region, referring respectively to the pattern data of the chip region adjacent to the target chip region, and pattern data of the shot region adjacent to the target chip region in consideration of the exposure layout shown in FIG. 10.

Third Embodiment

The present embodiment will explain light exposure correction adapted to the long-range flare.

Figure 20:
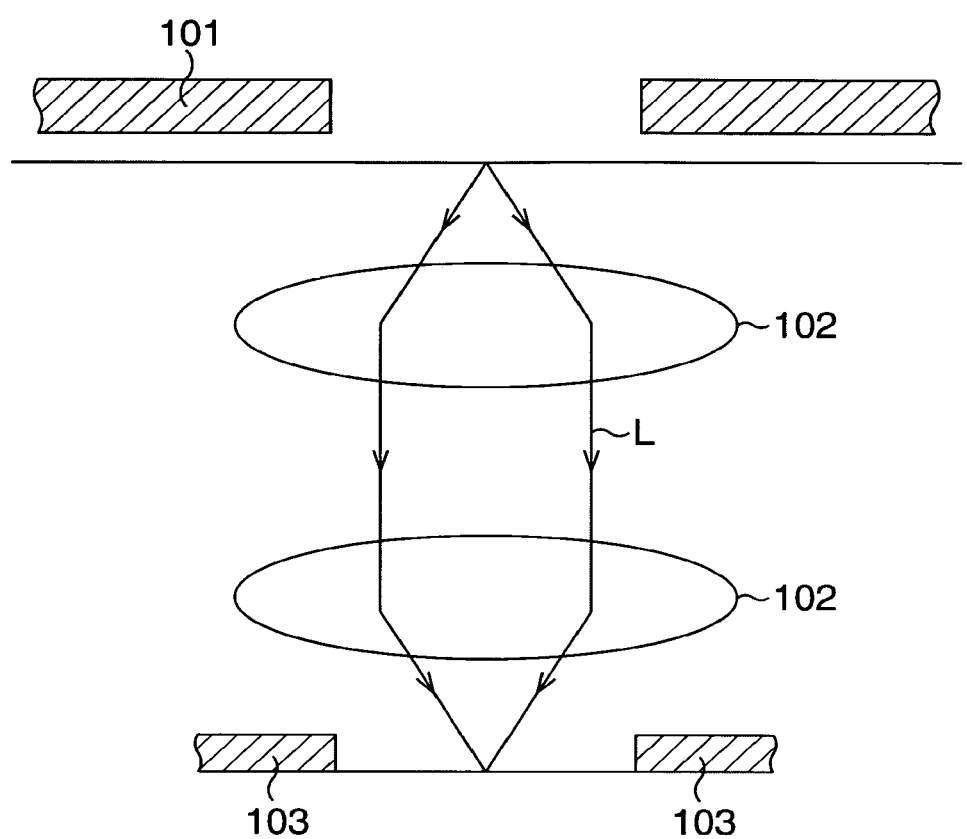
FIG. 20 is a schematic drawing showing a general light exposure apparatus.

The long-range flare exerts its influence over a range as long as several millimeters, and shows a moderate variation in the intensity distribution thereof rather than in a local manner. FIG. 20 shows a general light exposure apparatus. In the light exposure apparatus, light L from an unillustrated light source is narrowed through a shutter 101, and is allowed to pass through an optical lens 102, and thereby reaches a photoresist on the surface of a wafer. A part of the light L herein reaches a portion 103 outside the target shot region 4, which is recognized as flare. In the present embodiment, the flare is measured using an illuminance sensor mounted on the light exposure apparatus.

Figure 21:
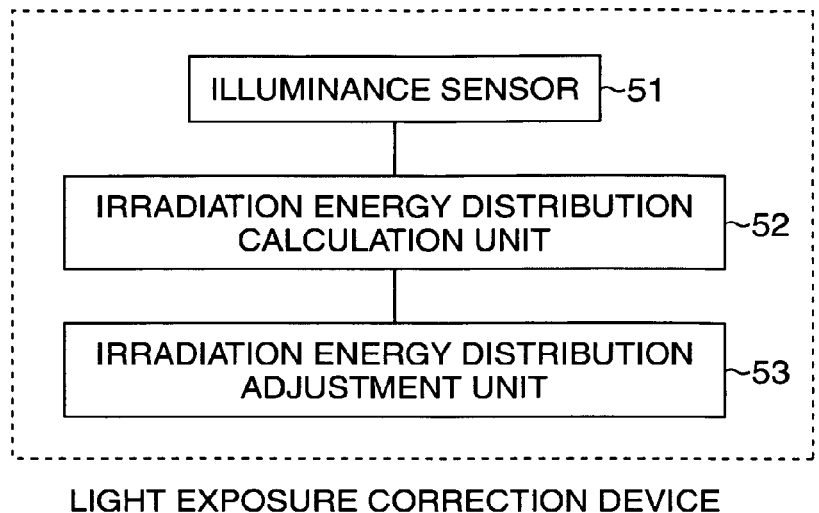
FIG. 21 is a block diagram showing a schematic configuration of a mask pattern data correction device according to a third embodiment.

FIG. 21 is a block diagram showing a schematic configuration of a light exposure correction device according to the third embodiment.

The light exposure correction device is configured as having an illuminance sensor 51 which is a flare energy measurement unit measuring, when the shot region is irradiated by the exposure light, flare energy generated around the shot region; an irradiation energy distribution calculation unit 52 calculating irradiation energy distribution of the exposure light in the shot region necessary for obtaining the transferred pattern of a predetermined dimension, based on the measured flare energy; and an irradiation energy distribution adjustment unit 53 adjusting irradiation energy distribution of the exposure light in the shot region, based on the calculated irradiation energy distribution.

Figure 22:
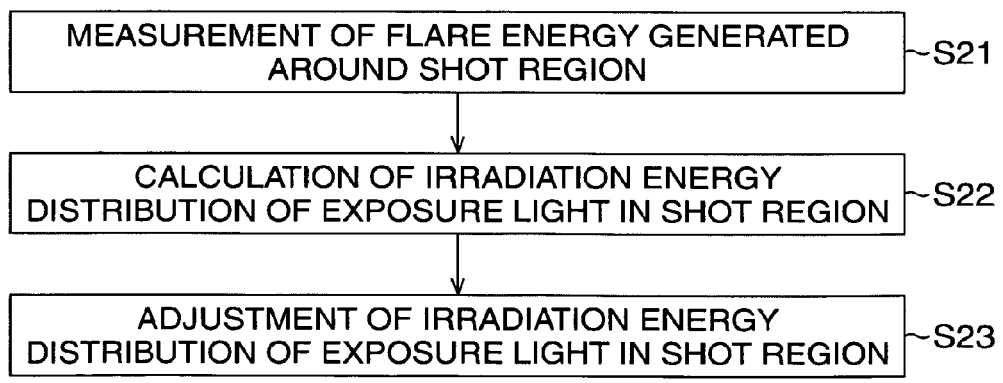
FIG. 22 is a flow chart step-wisely showing a correction method using the data correction device of the third embodiment.

FIG. 22 is a flow chart step-wisely showing a correction method using the above-described light exposure correction device.

The method of correcting light exposure of the present embodiment comprises three steps described below:

(1) measurement of flare energy generated around the shot region (step S21);

(2) calculation of an irradiation energy distribution of the exposure light in the shot region (step S22); and (3) adjustment of the irradiation energy distribution of the exposure light in the shot region (step S23).

The following paragraphs will detail the individual steps.

(1) Step S21

First, flare energy generated around the shot region is measured using the illuminance sensor.

Figure 23B:
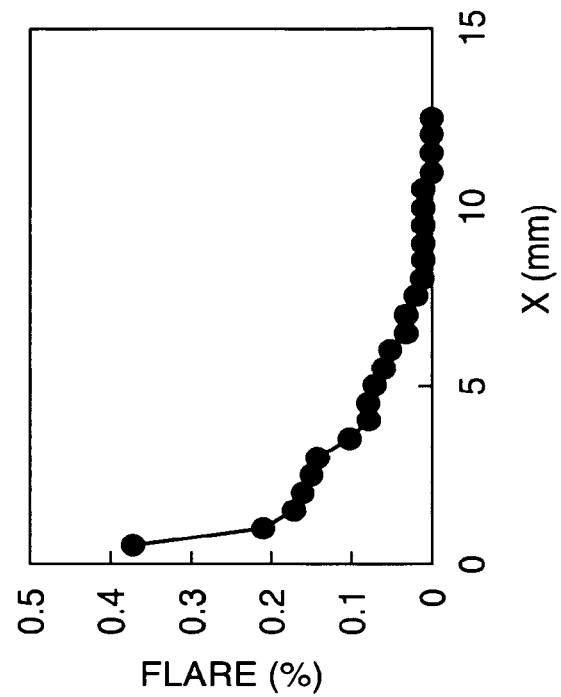
FIG. 23A and FIG. 23B are a schematic drawing and a characteristic chart, respectively, showing measurement of flare irradiated outside a target shot region.
Figure 23A:
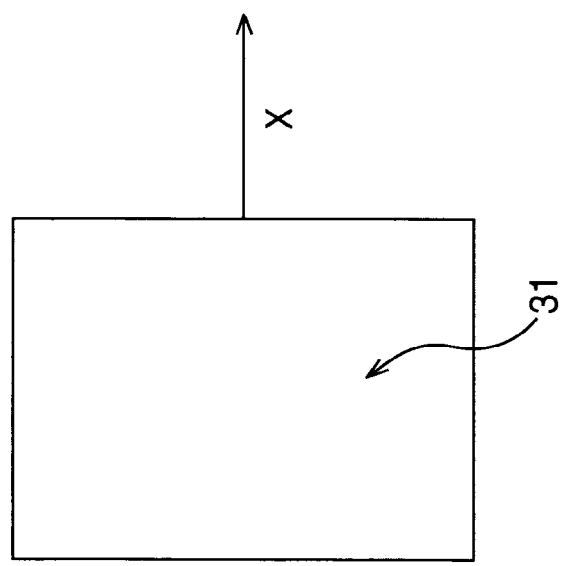

FIG. 23A and FIG. 23B shows measurement of flare irradiated outside a target shot region, wherein FIG. 23A is a schematic drawing of the shot region which is a site of measurement of the flare, and FIG. 23B is a characteristic chart showing results of the measurement.

In FIG. 23B, the abscissa plots distance from the peripheral portion of the shot region, and the ordinate plots flare energy (%). Irradiated energy obtained through a portion allowing complete transmission of the light in the shot region is normalized by 1, and irradiated energy outside the shot region is defined as flare energy. FIG. 23B shows only results of a linear measurement, wherein it is also allowable to measure the flare over the entire region outside the shot region.

(2) Step S22

An effective energy distribution in the target shot region can be determined by summing up flare from the adjacent shot regions typically in the exposure layout including a plurality of shot regions as shown in FIG. 10, using the irradiation energy distribution calculation unit 52.

(3) Step S23

The exposure energy distribution is adjusted, using the irradiation energy distribution adjustment unit 53, so as to make the calculated effective energy distribution uniform.

As has been described in the above, the present embodiment makes it possible to estimate and correct flare with an extremely high accuracy, over the entire portion of a single shot region, to realize a lithographic process causative of only an extremely small dimensional variation in line width, and further to thereby realize highly-reliable semiconductor devices.

Other Embodiments Applied with the Present Invention

The individual units for composing the data correction device and light exposure correction device, and the individual steps (steps S1 to S5 in FIG. 2; steps S1 to S3, S11 and S5 in FIG. 13; steps S1, S2, S12, S4, S13 and S14 in FIG. 17; steps S1, S2, S12, S11, S13 and S14 in FIG. 19; steps S21 to S23 in FIG. 22, etc.) according to the above-described embodiments can be realized by running a program stored in a RAM, ROM and so forth of a computer. Any programs and any computer-readable recording medium having the program stored therein are also included in a scope of the present invention.

More specifically, the above-described program is provided to a computer, typically as being recorded in a recording medium such as CD-ROM, or as being mediated by various transmission media. Examples of the recording medium storing the program, other than CD-ROM, include flexible disk, hard disk, magnetic tape, magneto-optical disk and non-volatile memory card. On the other hand, what is available as the program transmission media is a communication medium (wired line typically using optical fiber or the like, and wireless line, etc.) in a computer network (LAN, WAN such as the Internet, wireless communication network, etc.) allowing a program information to transmit on a carrier wave for the supply.

The program is also included in a scope of the present invention not only for the case where the functions of the aforementioned embodiments are realized through execution of a supplied program, but also for the case where the functions of the aforementioned embodiments are realized by the program in cooperation with an OS (operating system) or with any other application software or the like, run on the computer, and still also for the case where the functions of the aforementioned embodiments are realized by the entire portion or a part of processes of the supplied program executed by a function expansion board or a function expansion unit of the computer.

Figure 24:
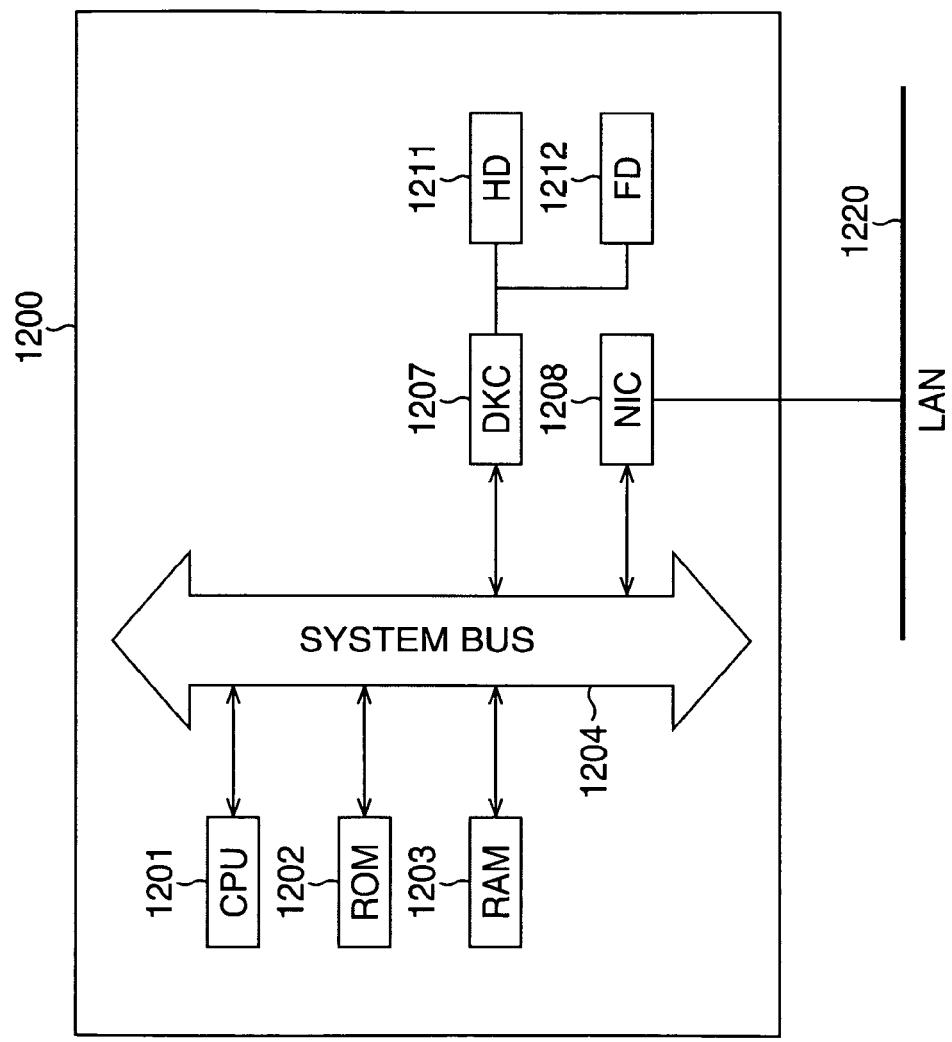
FIG. 24 is a schematic drawing showing an internal configuration of a personal user terminal device.
Figure 25:
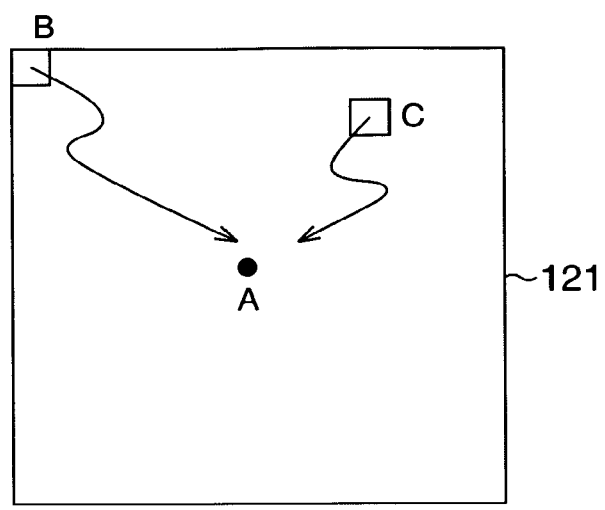
FIG. 25 is a drawing schematically showing a mode of flare generation.

As one example, FIG. 24 shows a schematic drawing of an internal configuration of a personal user terminal device. In the drawing, reference numeral 1200 denotes a computer PC. The PC 1200 has a CPU 1201, executes a device control software stored in a ROM 1202 or in a hard disk (HD) 1211, or supplied from a flexible disk drive (FD) 1212, to thereby generally control the individual devices connected to a system bus.

What is claimed is:

1. A mask pattern correction device used in pattern transfer, onto a target object for pattern transfer, of a mask pattern of a photomask under light exposure repeated multiple number of times to thereby form a transferred pattern, comprising:

a numerical aperture calculation unit calculating, for each and every one of a plurality of shot regions having a transferred pattern formed by a single time of light exposure through a mask pattern and each and every one of a plurality of chip regions comprised in one of the shot regions, a numerical aperture of the mask pattern corresponding to the transferred pattern onto the target object based on an exposure layout of the plurality of shot regions while considering a first flare due to influence from the peripherals of the shot region and a second flare due to influence from the peripherals of the chip region; and a dimension calculation unit calculating a dimension of the mask pattern necessary for obtaining the transferred pattern of a predetermined dimension, using the numerical aperture calculated in the above;

wherein the numerical aperture calculation unit calculates an average numerical aperture for the plurality of shot regions and chip regions, corrects a design value of the numerical aperture for the plurality of shot regions and chip regions for the calculation using the average numerical aperture, and calculates an effective value of the numerical aperture for the shot regions and chip regions for the calculation.

2. A light exposure correction device used in pattern transfer, onto a target object for pattern transfer, of a mask pattern of a photomask under light exposure repeated multiple number of times to thereby form a transferred pattern, comprising:

a numerical aperture calculation unit calculating, for each and every one of a plurality of shot regions having a transferred pattern formed by a single time of light exposure through a mask pattern and each and every one of a plurality of chip regions comprised in one of the shot regions, a numerical aperture of the mask pattern corresponding to the transferred pattern onto the target object based on an exposure layout of the plurality of shot regions while considering a first flare due to influence from the peripherals of the shot region and a second flare due to influence from the peripherals of the chip region;

an irradiation energy distribution calculation unit calculating an irradiation energy distribution of the exposure light in each of the shot region necessary for obtaining the transferred pattern of a predetermined dimension, using the numerical aperture calculated in the above; and an irradiation energy distribution adjustment unit adjusting the irradiation energy distribution of the exposure light in each of the shot region, based on the irradiation energy distribution calculated in the above, wherein the numerical aperture calculation unit calculates an average numerical aperture for the plurality of shot regions and chip regions, corrects a design value of the numerical aperture for the plurality of shot regions and chip regions for the calculation using the average numerical aperture, and calculates an effective value of the numerical aperture for the shot regions and chip regions for the calculation.

* * * * *